United States Patent [19]
Yoder

[11] 4,325,181
[45] Apr. 20, 1982

[54] SIMPLIFIED FABRICATION METHOD FOR HIGH-PERFORMANCE FET

[75] Inventor: Max N. Yoder, Falls Church, Va.

[73] Assignee: The United States of America as represented by the Secretary of the Navy, Washington, D.C.

[21] Appl. No.: 217,306

[22] Filed: Dec. 17, 1980

[51] Int. Cl.³ ............................................. H01L 21/20
[52] U.S. Cl. ................................... 29/571; 29/576 E; 29/580; 29/591; 148/171; 148/175; 357/15
[58] Field of Search ............. 29/571, 580, 591, 576 E; 357/15; 148/171, 175

[56] References Cited

U.S. PATENT DOCUMENTS

| | | | |
|---|---|---|---|
| 3,042,565 | 7/1962 | Lehovec | 29/580 X |
| 3,858,304 | 1/1975 | Leedy et al. | 29/578 |
| 3,866,310 | 2/1975 | Driver et al. | 29/571 |
| 3,898,353 | 8/1975 | Napoli et al. | 29/571 X |
| 3,900,944 | 8/1975 | Fuller et al. | 29/580 X |
| 3,951,708 | 4/1976 | Dean | 29/571 X |
| 3,957,552 | 5/1976 | Ahn et al. | 156/11 |
| 3,999,281 | 12/1976 | Goronkin | 29/571 |
| 4,004,341 | 1/1977 | Tung | 29/571 |
| 4,048,712 | 9/1977 | Buiatti | 29/571 |
| 4,062,103 | 12/1977 | Yamagishi | 29/580 |
| 4,111,725 | 9/1978 | Cho et al. | 148/175 |
| 4,188,710 | 2/1980 | Davey et al. | 29/580 |

*Primary Examiner*—G. Ozaki

[57] ABSTRACT

A method for making reproducible FET's with gate dimensions in the submicrometer range, reduced source-gate channel resistance, and reduced gate and source contact resistances comprising forming, in order, on a semi-insulating substrate, of GaAs, an N-type GaAs layer, an (N+) GaAs layer and an (N++) Ge layer, using a photolith process with a mask to form the gate channel region therein, forming a refractory metal layer covering the whole top of the device, forming a gold layer on the refractory metal, using a photolith method with a common mask and etch process to cut the gate, source and drain electrodes to their desired sizes and using a plasma etch process to cut away, except for a stalk supporting the gate Au electrode, the remaining refractory metal from a portion of the gate channel lying between the gate and source electrode region and lying between the gate and drain electrode region.

8 Claims, 5 Drawing Figures

010f
SIMPLIFIED FABRICATION METHOD FOR HIGH-PERFORMANCE FET

BACKGROUND OF THE INVENTION

This invention relates generally to semiconductor field-effect transistors and especially to a simplified method for making such devices.

Critical factors in achieving lowest noise figure in small-signal field-effect transistor (FET) microwave amplifiers are:

1. reduction of control gate length to submicrometer dimensions;
2. reduction of source contact and source lead resistance;
3. reduction of source-to-gate channel resistance;
4. reduction of interface states (electron and/or hole traps within the semiconducting material and/or its interfaces);
5. production of high mobility material; and
6. reduction of control gate resistance. Significant improvements in one or more of the above factors will lead to substantial improvements in FET microwave amplifiers.

SUMMARY OF THE INVENTION

An object of this invention is to improve the performance of FET's and FET microwave amplifiers.

Another object is to improve the manufacture of FET's so that the control gate length can be reproducibly made in submicrometer dimensions.

A further object is to improve the manufacture of FET's so that FET's with reduced control gate resistance and source-to-gate channel resistance can be reproducibly obtained.

These and other objects and advantages are obtained in the present invention by forming, in order, on a semi-insulating substrate of semiconductor material an (N) layer of semiconductor material, an (N+) layer of semiconductor material and an (N++) layer of lower bandgap semiconductor material, forming a gate channel therein by etching through the N-type active channel, depositing a refractory metal layer and then a layer of gold thereon, using a common mask photolith process and etch process to cut the source, gate and drain Au electrodes to the proper size, and then, using the remaining Au as a mask, employing a plasma etch process to cut away, except for a stalk supporting the gate electrode, the remaining refractory metal from a portion of the gate channel lying between the gate and source electrode region and lying between the gate and drain electrode region, thereby making the source-gate distance and resistance small.

BRIEF DESCRIPTION OF THE DRAWINGS

The exact nature of this invention as well as other objects and advantages thereof will be readily apparent from consideration of the following specification and drawings in which.

DETAILED DESCRIPTION OF THE INVENTION

Figure 1:
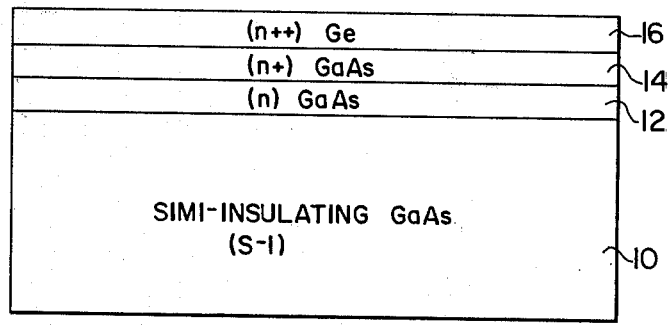
FIG. 1 is a schematic illustration showing the semiconductor layers of a GaAs base for a FET, the layers being covered by an (N++) layer of Ge.

FIG. 1 shows the start of the process of fabricating a FET in accordance with this invention. Starting with a semi-insulating (S-I) substrate 10 preferably of GaAs although an InP substrate could be used, an N-type active channel region 12 is ion-implanted or epitaxially grown using conventional techniques. Carrier concentration and the thickness of the active channel region are chosen so as to optimize the characteristics of the device to be fabricated. On top of the N-type active channel 12, a thin (e.g., 250Å) layer 14 of (N+) GaAs is grown such that a donor carrier concentration of 1 to $5 \times 10^{18}/cm^3$ is achieved. Selenium, sulfur, or combination of silicon and sulfur or silicon and selenium may be used to obtain this doping level. As an alternative to N+ epitaxial growth, ion implantation may be used.

An (N++) Ge layer 16 is next grown on the (N+) GaAs layer. This Ge layer is typically grown in a high-vacuum evaporator held at $10^{-7}$ arsenic vapor pressure. Thickness should be minimum of 50Å and preferably should be about 250Å. Vapor epitaxial deposition via the decomposition of germane ($GeH_4$) and arsine ($AsH_3$) is an alternative method of growing the Ge layer, as are still other techniques of epitaxial growth or deposition followed by crystallization. The donor concentration in this region 16 should be about $1 \times 10^{20}/cm^3$. The purpose of the (N++) Ge layer is to reduce the specific contact resistivity. Virtually any metal deposited over the Ge will form a tunnel contact exhibiting specific contact resistivities lower than $10^{-8}$ ohm-$cm^2$ and this is achieved without alloying.

Figure 2:
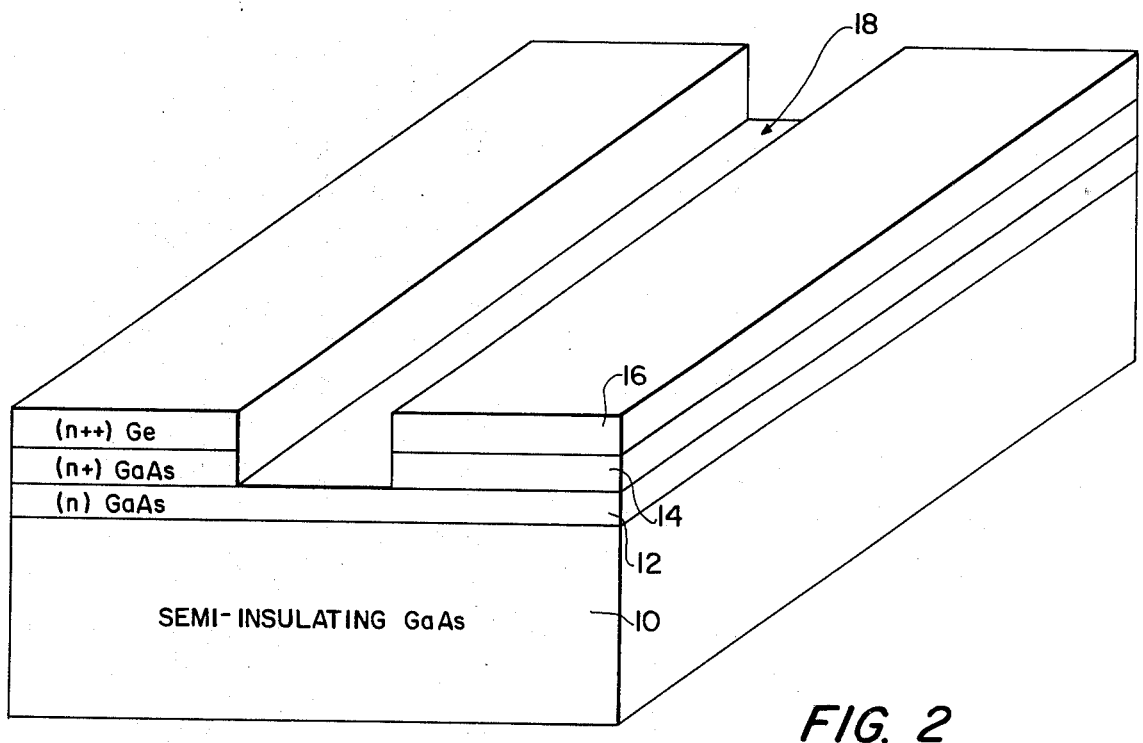
FIG. 2 is a schematic illustration showing the gate channel cut through the device of FIG. 1.

The control gate channel region 18 (see FIG. 2) is now opened, as well as interdevice separation regions (not shown), using conventional photoresist and photolith procedures followed by a chemical etch. Where the (N−) layer (12) thickness in the gate-channel region 18 is very critical, standard anodic etch procedures may be used following the chemical etch.

Figure 3:
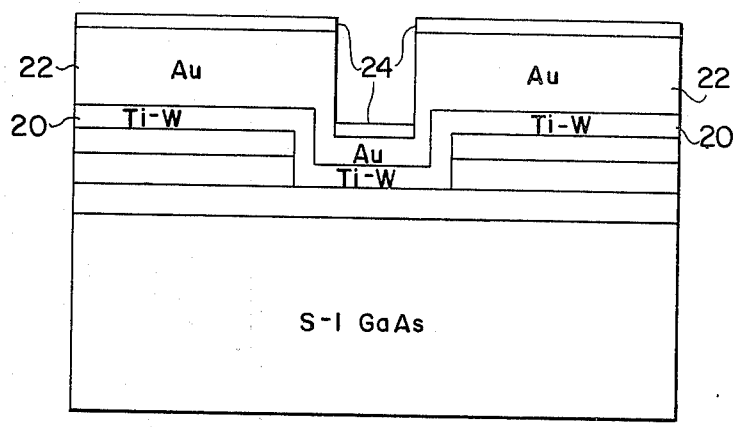
FIG. 3 is a schematic illustration showing the successive refractory layer and gold layer which are then deposited.

Once the active channel region is opened, a refractory metal layer 20, e.g., an alloy of $Ti_{0.12}$-$W_{0.88}$, or Ti-Pt, is deposited (see FIG. 3) and then an overlay 22 of Au.

Figure 4:
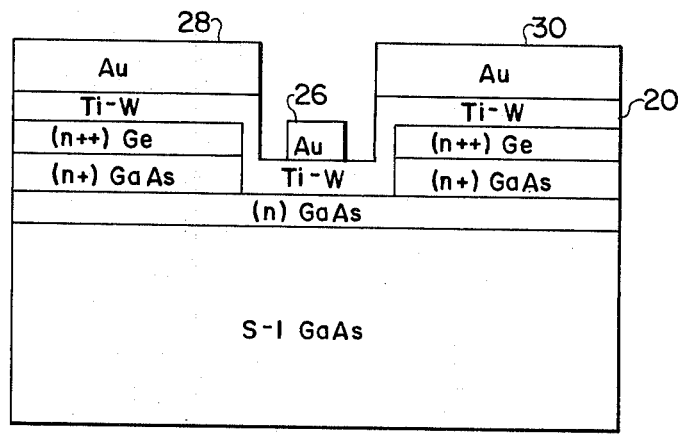
FIG. 4 is a schematic illustration showing how the Au layer is etched away to form the electrodes.
Figure 5:
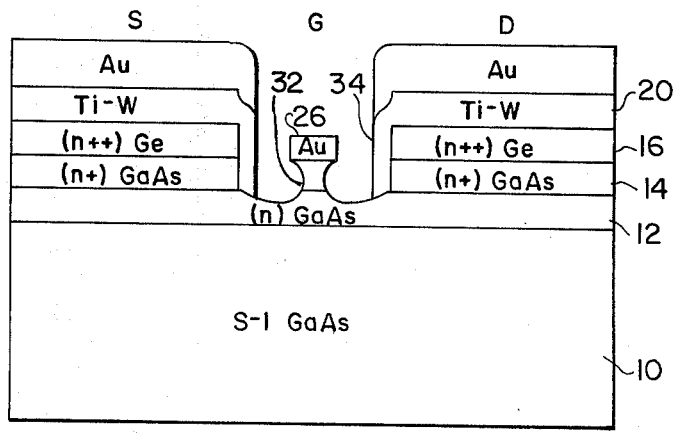
FIG. 5 is a schematic illustration showing how the refractory metal lying above the active channel is etched away from the active channel leaving the Au gate electrode sitting on a refractory metal stalk on the active channel.

The process of forming of the electrodes is now started by depositing a film of photoresist 24 over the Au layer 22. The desired electrode-pattern mask is placed over the photoresist layer 24 and an exposure is made where the Au layer is not desired. The mask is removed and the exposed gold is etched away, as shown in FIG. 4, by a conventional method to form a source electrode 28, gate electrode 26 and drain electrode 30. The etch solution used here is one to which the Ti-W metal is not sensitive but to which the Au is; thus, the Au is etched down to the Ti-W layer. An etch solution such as Metex Aurostrip-407 made by Macdermid, Inc. is the preferred solution. Another solution is a combination of KI, I and $H_2O$. Of course a conventional photolith process in which the photoresist is lifted off taking the undesired Au portions with it can also be employed, if desired. A plasma etch is then used to etch away the Ti-W as shown in FIG. 5, leaving a small (submicrometer dimension) Au control-gate electrode 26 sitting on an undercut Ti-W stalk 32. A pair of vertical layers 34 of Ti-W are also left after the plasma etch, extending from the Ti-W layer 20 to the active channel region 12 between the source region (S) and the gate G and also between the gate G and the drain region D. These metal regions in contact with the (N) GaAs active channel region 12 act to reduce the source-gate resistance and the gate-drain resistance, a very favorable condition for the FET.

The plasma etch can be accomplished by removing all but a few monolayers of Ti-W with a gas consisting of $CF_4$ and about 2% of oxygen. The remaining Ti-W can then be removed with dilute HF or with the "Bell Labs etch" consisting of 0.25 moles $KH_2PO_4$, 0.23 moles KOH and 0.10 moles $K_3FeCN_6$ mixed in 500 cc. of distilled $H_2O$. After this, add 500 cc. more of the $H_2O$ and continue the etch. The final product is shown in FIG. 5.

A prime advantage of this method is that the processing is simplified and is made easily reproducible. The source gate and drain regions are metallized in the same step and a single mask is used to delineate their respective patterns (in a photolith process). If mask realignment (between active and isolation region opening and electrode definition) is not perfect, the exposed N+ semiconductor region 14 can be etched away (in conjunction with the final Ti-W etch) much faster than the exposed N-type channel region 12. Thus, a lack of perfect realignment is not critical and can be compensated for.

The use of a common mask for all gate electrodes permits the metallization of (N++) Ge (source and drain regions) to act as a tunnelling contact exhibiting extremely low specific contact resistivity whereas, when the same metallization falls on the lower-doped N-type active channel, it acts as a rectifying Schottky contact. Since the Au plus refractory metal layers can be made very thick (e.g., 2 micrometers), their resistance must be kept very low. Aspect ratios can be very high (e.g., 10:1) such that linear resolution in the plane of the semiconductor surface may be kept very low (e.g., submicrometer). This aspect is particularly relevant for dual-gate cascade FET amplifier work wherein the separation between gates 1 and 2 must be kept very short (e.g., <1 micrometer) to avoid undesirable phase-shift dispersion at higher frequencies. The same common mask approach can be used to reproducibly reduce source-gate channel lengths and thus source-gate channel resistance.

Another application where this common mask approach can be very useful is in fabricating common source, push-pull monolithic amplifiers where the source contact transfer length can be readily reduced, thus reducing source resistance for the fundamental frequency signal.

Finally, the use of tunnelling contacts avoids the necessity of alloying after metal deposition; in so doing, surface-state density in the exposed semiconductor region is believed to be reduced.

Obviously, many modifications and variations of the present invention are possible in light of the above teachings. It is therefore to be understood that, within the scope of the appended claims, the invention may be practiced otherwise than as specifically described.

What is claimed is:

1. A method for producing a high-performance FET comprising the steps of:
   forming on a semi-insulating semiconductor substrate an N-type layer of the substrate material which will constitute the active channel of the FET;
   forming on the N-type layer an (N+) layer of the substrate material;
   forming on the (N+) layer an (N++) layer of lower bandgap material;
   cutting a channel through the (N++) lower-bandgap material and the (N+) semiconductor to form a gate channel along the top of the (N) layer of semiconductor;
   forming a layer of refractory metal on all exposed portions of the previous layers;
   forming a layer of metal on the refractory metal layer;
   using a common mask to delineate the areas which are to to be the gate, source and drain electrodes and forming a properly exposed photoresist layer under said comon mask;
   cutting through said exposed photoresist and metal layers to form metal source, gate and drain electrodes of the proper size; and
   cutting through the refractory metal in the gate channel region to remove the remaining refractory metal lying above the active channel except for a stalk under the gate electrode and a pair of vertical regions extending from the refractory metal layers lying under the metal source and drain electrodes to the top of the active channel layer.

2. A method as in claim 1 wherein:
   said substrate is formed from GaAs, and said refractory metal is a Ti-W alloy.

3. A method as in claim 2 wherein:
   said metal lying on refractory metal is Au.

4. A method as in claim 3, wherein said step of forming the source, gate and drain electrodes comprises:
   depositing a layer of photoresist material upon the device after the forming of the Au layer;
   exposing the masked device to light in the areas in which the Au is to be removed;
   etching away the exposed photoresist and the gold beneath it; and
   removing the unexposed photoresist to leave Au electrodes of the proper sizes on the device.

5. A method as in claim 4, wherein said step of cutting through the refractory metal lying above the active channel comprises:
   etching the exposed refractory metal with a plasma etch fluid while using the remaining Au overlayer as an etch mask.

6. A method as in claim 5, wherein said plasma etch fluid is a gas formed from $CH_4$ with 2% of oxygen.

7. A method as in claim 6 wherein, if any refractory metal remains along the top of the active channel between the stalk and the vertical portions of refractory metal after the plasma etch, it is removed by the further step of treating it with a solution comprising:

0.25 moles of $KH_2PO_4$,
   0.23 moles of KOH, and
   0.10 moles of $K_3FeCn_6$.

8. A method as in claim 6, wherein if any refractory metal remains along the top of the active channel between the stalk and the vertical portions of refractory metal after the plasma etch, it is removed by the further step of treating it with dilute HF.

* * * * *